United States Patent
Crook et al.

(10) Patent No.: US 10,096,468 B2
(45) Date of Patent: Oct. 9, 2018

(54) METHOD OF IMPROVING ADHESION

(71) Applicant: SPTS Technologies Limited, Newport (GB)

(72) Inventors: Kathrine Crook, Wotton-Under-Edge (GB); Stephen R Burgess, Gwent (GB); Andrew Price, Gwent (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 35 days.

(21) Appl. No.: 15/383,162

(22) Filed: Dec. 19, 2016

(65) Prior Publication Data
US 2017/0178901 A1  Jun. 22, 2017

(51) Int. Cl.
*H01L 21/02* (2006.01)
*H01L 29/06* (2006.01)

(52) U.S. Cl.
CPC .... *H01L 21/02304* (2013.01); *H01L 21/0217* (2013.01); *H01L 21/02164* (2013.01); *H01L 21/02167* (2013.01); *H01L 21/02274* (2013.01); *H01L 21/02381* (2013.01); *H01L 29/0649* (2013.01)

(58) Field of Classification Search
CPC .......... H01L 21/0217; H01L 21/02381; H01L 21/02304; H01L 21/02164; H01L 21/02274; H01L 29/0649; H01L 21/02167; H01L 21/02271; H01L 21/0228
See application file for complete search history.

(56) References Cited

U.S. PATENT DOCUMENTS

| | | | |
|---|---|---|---|
| 5,426,076 A | 6/1995 | Moghadam | |
| 6,143,666 A | 11/2000 | Lin et al. | |
| 8,178,447 B1 | 5/2012 | Fan et al. | |
| 2008/0026553 A1* | 1/2008 | Chua | H01L 21/0217 438/591 |
| 2011/0104866 A1 | 5/2011 | Ruelke et al. | |
| 2012/0009413 A1* | 1/2012 | Menezes | B82Y 10/00 428/304.4 |
| 2014/0000686 A1* | 1/2014 | Mungekar | H01L 31/02167 136/252 |

FOREIGN PATENT DOCUMENTS

| | | |
|---|---|---|
| CN | 104716055 A | 6/2015 |
| EP | 1168437 A2 | 1/2002 |

OTHER PUBLICATIONS

Marzieh Abbasi-Firouzjah et al., "The effect of TEOS plasma parameters on the silicon dioxide deposition mechanisms", Journal of Non-Crystalline Solids., vol. 368, May 1, 2013, pp. 86-92.
(Continued)

*Primary Examiner* — Jasmine Clark

(57) ABSTRACT

A method is for improving adhesion between a semiconductor substrate and a dielectric layer. The method includes depositing a silicon dioxide adhesion layer onto the semiconductor substrate by a first plasma enhanced chemical vapor deposition (PECVD) process, and depositing the dielectric layer onto the adhesion layer by a second PECVD process. The first PECVD process is performed in a gaseous atmosphere comprising tetraethyl orthosilicate (TEOS) either in the absence of $O_2$ or with $O_2$ introduced into the process at a flow rate of 250 sccm or less.

17 Claims, 4 Drawing Sheets

(56) References Cited

OTHER PUBLICATIONS

Mahajan A M et al., "Influence of process parameters on the properties of TEOS-PECVD-grown SiO"2 films", Surface and Coatings Technology, Elsevier BV, Amsterdam, NL, vol. 188-189, Nov. 1, 2004, pp. 314-318.
European Search Report in Related EP Application No. EP 16 20 4943 dated Mar. 21, 2017.

\* cited by examiner

METHOD OF IMPROVING ADHESION

BACKGROUND

This invention relates to a method of improving adhesion between a semiconductor substrate and a dielectric layer. The method relates also to a structure comprising a semiconductor substrate, a dielectric layer and a silicon dioxide adhesion layer.

There are a great many processes, structures and devices of commercial significance which involve the deposition of a dielectric layer onto a surface of a semiconductor substrate. One example is the manufacture of CIS (CMOS Image Sensor) products. In these manufacturing processes, it is necessary to deposit a dielectric layer by plasma enhanced chemical vapour deposition (PECVD) for TSV (Through Silicon Via) isolation and interposer passivation in via reveal applications. Low temperature, high etch rate silicon etch processes produce a significant amount of unwanted polymeric by-product. This is particularly pronounced in TSV and Via Reveal Applications. The polymer by-product needs to be removed before any isolation layers are deposited. One reason for this is that the presence of polymeric by-product compromises the adhesion of subsequently deposited dielectric layers. Removal of the by-product requires multiple cleaning steps, including $O_2$ ashing and an EKC polymer strip. These processes can themselves result in other residues remaining on the silicon surface. These residues can also result in poor adhesion of dielectric layers.

Typically, 300 mm silicon substrates are bonded to glass carrier substrates prior to thinning and etching of the silicon. The adhesive used for the bonding has unstable vacuum properties which necessitate that outgassing is carried out prior to CVD deposition. However, there is potential for the outgas by-products to contaminate the silicon surface. Contamination of the silicon surface by processes such as these is undesirable. One consequence of the contamination is that the adhesion of subsequently deposited dielectric layers is compromised. Therefore, it can be seen that it can be challenging to ensure adequate adhesion of dielectric layers to semiconductor structures as part of commercial fabrication processes.

SUMMARY

It will be appreciated that, in addition to the specific problems described above, there is a general desire and need to improve the adhesion of dielectric layers to semiconductor substrate such as silicon, whether or not the semiconductor surface is contaminated. The present invention, in at least some of its embodiments, addresses these problems, desires and needs.

According to a first aspect of the invention there is provided a method of improving adhesion between a semiconductor substrate and a dielectric layer comprising the steps of:
 depositing a silicon dioxide adhesion layer onto the semiconductor substrate by a first Plasma Enhanced Chemical Vapor Deposition (PECVD) process; and
 depositing the dielectric layer onto the adhesion layer by a second PECVD process;
 in which the first PECVD process is performed in a gaseous atmosphere comprising tetraethyl orthosilicate (TEOS) either in the absence of $O_2$ or with $O_2$ introduced into the process at a flow rate of 250 sccm or less.

$O_2$ may be introduced into the process at a flow rate of 100 sccm or less, preferably 10 sccm or less. Most preferably, no $O_2$ is introduced into the process.

The semiconductor substrate may be silicon.

The semiconductor substrate onto which the adhesion layer is deposited may comprise additional non-semiconductor features. The non-semiconductor features may be metal features. For example, the semiconductor substrate may be a partially metallised silicon substrate having copper or tungsten features thereon. Typically, the non-semiconductor features constitute only a small proportion of the available surface area. Generally, the non-semiconductor features constitute less than 10% of the available surface area of the semiconductor substrate.

The semiconductor substrate may comprise a contaminated surface onto which the adhesion layer is deposited.

The semiconductor substrate may comprise a surface onto which the adhesion layer is deposited, wherein the surface is hydrophobic.

The dielectric layer which is deposited onto the adhesion layer may be a silicon-containing material. The dielectric layer may be silicon nitride, a silicon oxide or a silicon carbide. Where the dielectric layer is a silicon oxide, this may be silicon dioxide deposited using a suitable precursor such as TEOS or silane.

The dielectric layer which is deposited onto the adhesion layer may be hydrophilic.

The first PECVD process may use an RF signal to produce a plasma. The RF signal may be of a frequency of less than 400 kHz. Typically, the RF signal is of a frequency of greater than 100 kHz. Particularly advantageous results have been obtained using a single RF signal at these frequencies to produce the plasma.

It is also possible to use dual RF signals to produce the plasma, with one of the RF signals being of a relatively low frequency and the other RF signal being of a relatively high frequency. The RF power can be applied to a showerhead or a showerhead and platen assembly. Thus, the first PECVD process may additionally use a second RF signal to produce the plasma. The second RF signal may be of a frequency of greater than 400 kHz. Preferably, the second RF signal is of a frequency of 13.56 MHz.

The first PECVD process may be performed in a gaseous atmosphere which comprises TEOS, optionally $O_2$, and one or more further components.

The first PECVD process may be performed in a gaseous atmosphere which comprises $H_2$. $H_2$ may be introduced into the first PECVD process at a flow rate in the range 500 to 1200 sccm. The $H_2$ flow rate may be in the range 800-1100 sccm.

The first PECVD process may be performed with TEOS introduced into the process at a flow rate of 1.3 to 1.6 ccm.

The silicon dioxide adhesion layer may have a thickness of 1000 nm or less, preferably 200 nm or less. Thicker adhesion layers are within the scope of the invention. However, in embodiments where the silicon dioxide adhesion layer is a poorer dielectric than the dielectric layer which is deposited onto it, it may be beneficial to utilize a relatively thin adhesion layer, such an adhesion layer having a thickness of 200 nm or less.

The adhesion layer may have a $CH_x$:SiO ratio of at least 0.3%. The $CH_x$:SiO ratio may be at least 3%. The $CH_x$:SiO ratio as described herein is calculated by comparing peak areas obtained by Fourier Transform Infra-Red Spectroscopy (FTIR) which are associated with $CH_x$ and SiO absorptions. X may be 1 to 3. The $CH_x$:SiO ratio may be the ratio of the intergrated area of the $CH_x$ peaks at about 2900-3000 cm$^{-1}$ to the integrated area of the SiO peak at about 1800 cm$^{-1}$, expressed as a percentage.

The first PECVD process may be performed at a pressure in the range 2.0 to 4.0 Torr. The pressure may be in the range 2.0 to 3.5 Torr. The pressure may be in the range 2.0 to 3.0 Torr.

The first PECVD process may be performed at a temperature in the range 100 to 200° C.

According to a second aspect of the invention there is provided a semiconductor substrate, a dielectric layer and a silicon dioxide adhesion layer formed between the semiconductor substrate and the dielectric layer, the structure being manufactured by a method in accordance with the first aspect of the invention.

According to a third aspect to the invention there is provided a structure comprising a semiconductor substrate, a dielectric layer and a silicon dioxide adhesion layer formed between the semiconductor substrate and the dielectric layer, in which the adhesion layer has a CH$_x$:SiO ratio of at least 0.3%, as calculated by comparing peak areas obtained by FTIR which are associated with CH$_x$ and SiO absorptions, wherein x is 1 to 3. The adhesion layer may have a CH$_x$:SiO ratio of at least 3%.

Whilst the invention has been described above, it extends to any inventive combination of the features set out above or in the following description, drawings or claims.

BRIEF DESCRIPTION OF THE DRAWINGS

Embodiments of methods and structures in accordance with the invention will now be described with reference to the accompanying drawings, in which.

DETAILED DESCRIPTIONS OF EMBODIMENTS

Figure 4:
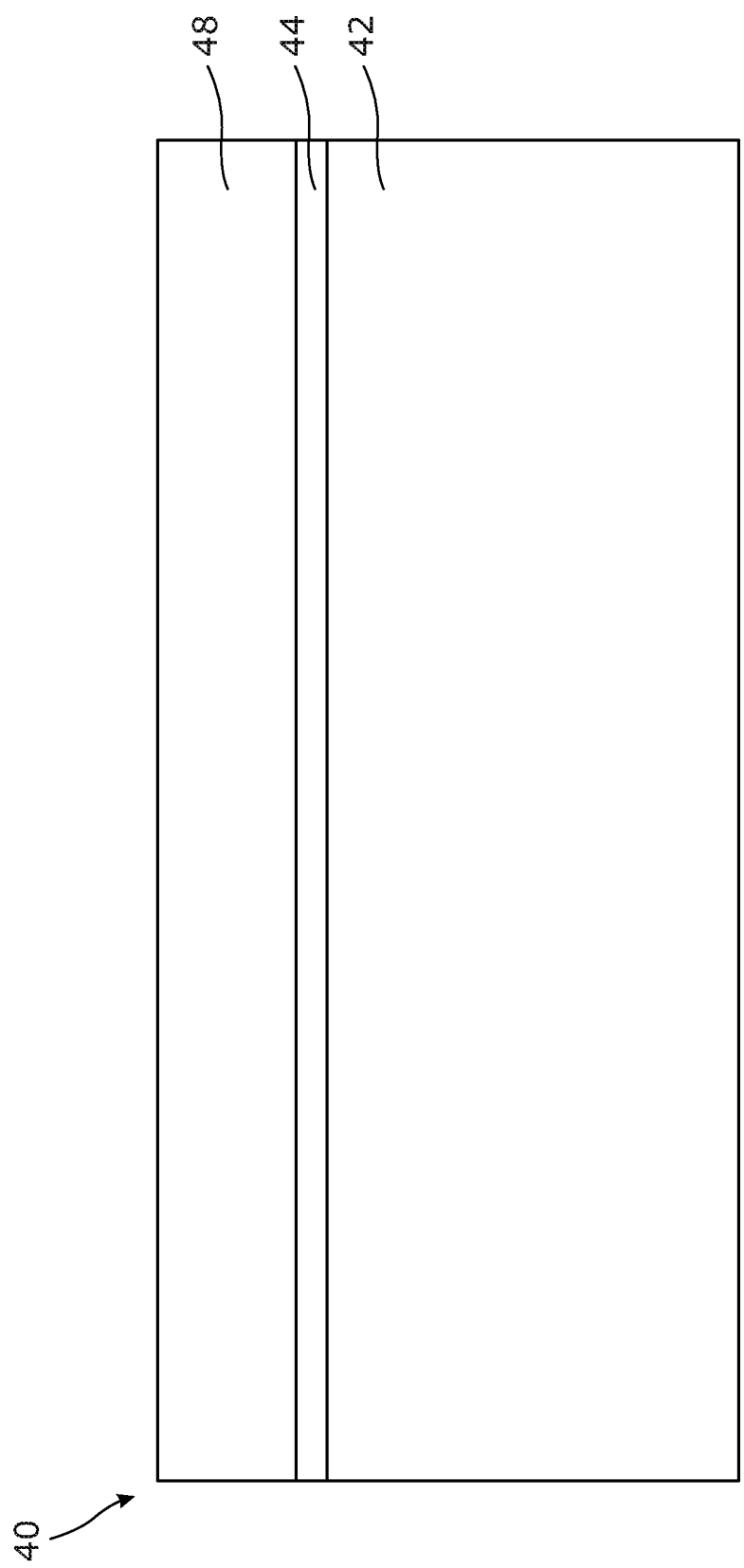
FIG. 4 is a schematic representation of a structure of the invention.

FIG. 4 is a schematic representation of the structure 40 of the invention comprising a semiconductor substrate 42, an adhesion layer 44 and a dielectric layer 48. The invention utilises the adhesion layer 44 to improve adhesion between the semiconductor substrate 42 and the dielectric layer 48. The adhesion layer 44 is a silicon dioxide layer which is deposited onto the semiconductor substrate 42 in a PECVD process which utilises a low oxygen flow or no oxygen flow at all. The dielectric layer 48 is deposited onto the adhesion layer 44 by PECVD. Examples of the invention and comparative examples are presented below.

Semiconductor Substrate

In order to replicate a contaminated silicon surface, a low temperature (50-200° C.) in-situ polymer strip plasma was run directly onto bare silicon surfaces. Typical process conditions are shown in Table 1.

TABLE 1

Polymer strip process (HF = high frequency RF = 13.56 MHz, LF = Low frequency RF = 380 kHz).

| Process Parameter | Typical Values |
| --- | --- |
| Time (sec) | 30 |
| Temperature (° C.) | 125 |
| Pressure (Torr) | 3.1 |
| Gas flows (sccm) | 2300O$_2$, 1000H$_2$ |
| RF Power (Watts) | 945 HF, 420 LF |

The contaminated silicon surface is believed to representative of the contaminated surfaces which commonly occur on device wafers.

Numerous PECVD depositions were made onto the contaminated silicon surfaces. The adhesion of the deposited layers was quantified by using a standard tape pull test. In the pull test, a 10×10 1 mm grid is diamond scribed through the film into the silicon substrate. Adhesive tape is applied to the surface of the film and pulled off perpendicularly to the silicon surface. A percentage adhesion pass is quoted which refers to how much of the film in the grid remains adhered to the silicon.

Adhesion Layer

Silicon dioxide adhesion layers were deposited in a TEOS PECVD process using little or no oxygen flow into the PECVD process. Table 2 shows typical ranges and preferred (although non-limiting) values for the PECVD process parameters. The low RF frequency utilised was 380 kHz and the high RF frequency utilised was 13.56 MHz. Other frequencies might instead be used. In general, a low RF frequency can be considered to be a frequency of less than 400 kHz, and a high RF frequency can be considered to be a frequency of 400 kHz or more.

TABLE 2

Process parameters for adhesion layer.

| Parameter | Range | Preferred |
| --- | --- | --- |
| Temperature (° C.) | 100-200 | 125 |
| Pressure (torr) | 2.5-4.0 | 3 |
| Oxygen (sccm) | 0-500 | 0 |
| Hydrogen (sccm) | 500-1200 | 1000 |
| TEOS (ccm) | 1.35-1.55 | 1.45 |
| Power (high frequency RF) (watts) | 0-600 | 0 |
| Power (low frequency RF) (watts) | 350-600 | 420 |

Adhesion tests were performed on silicon dioxide adhesion layers deposited under different conditions. The results are shown in Table 3.

TABLE 3

Adhesion tests of silicon dioxide adhesion layers (low pressure = 2.5 Torr, other processes at pressure of 4.0 Torr).

| Deposition Conditions | Adhesion Test Result |
| --- | --- |
| Low frequency RF, 500 sccm oxygen flow | 90% pass |
| High frequency RF, no oxygen flow | 100% pass |
| Low frequency RF, no oxygen flow | 100% pass |
| Low frequency RF, no oxygen flow, lower pressure | 100% pass |

Figure 1:
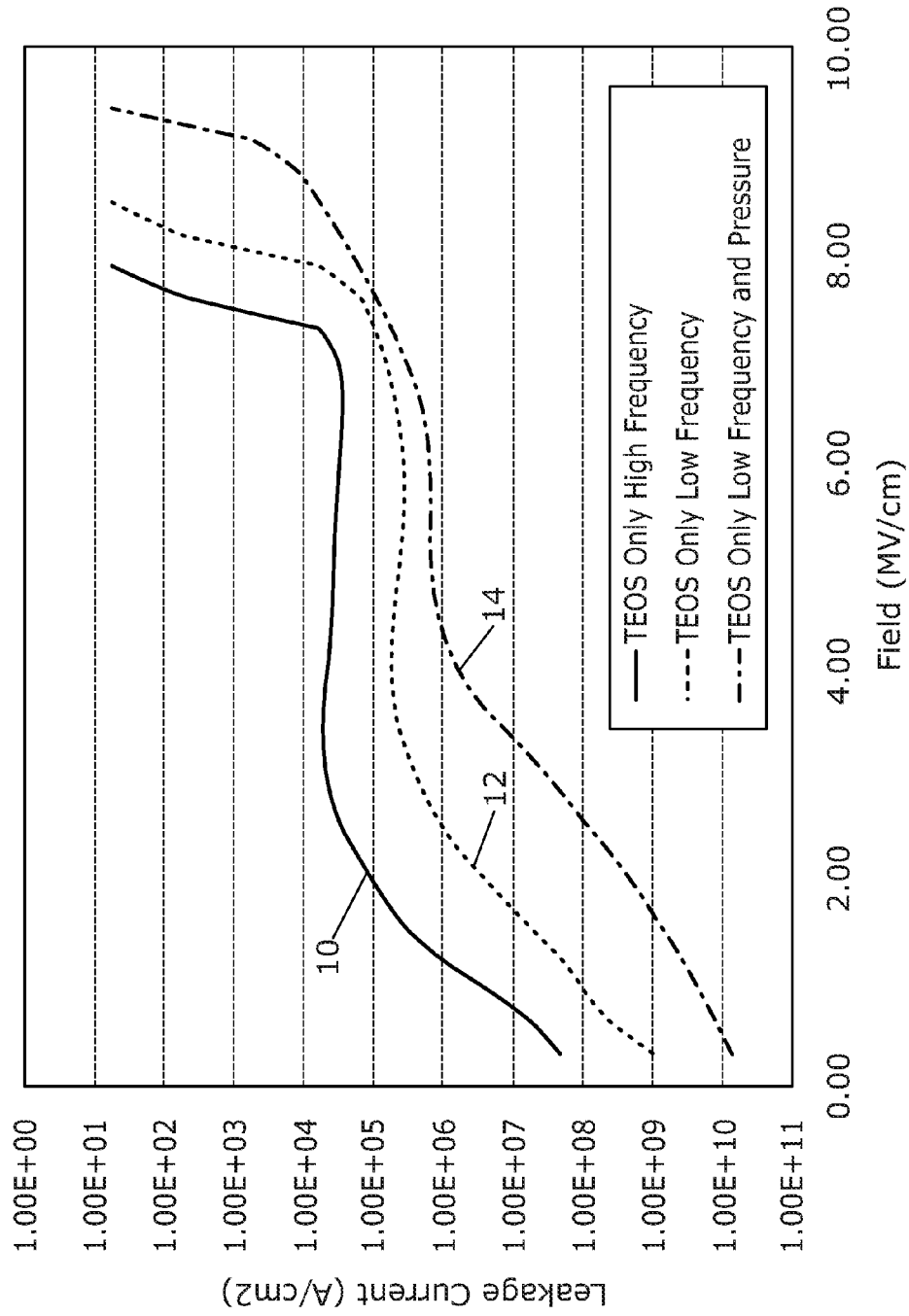
FIG. 1 shows I-V curves for three adhesion layers.

The films described in Table 3 which were deposited with no oxygen flow underwent further tests to investigate their electric characteristics. FIG. 1 shows I-V curves 10, 12, 14 for the high RF frequency, low RF frequency, and low RF frequency and low pressure embodiments, respectively. Table 4 shows leakage current and breakdown voltage.

TABLE 4

Leakage current at breakdown voltage for various films.

| | Leakage Current @ 2 MV/cm (A/cm2) | Breakdown Voltage (MV/cm) |
|---|---|---|
| High Frequency | 1.09E−05 | >7 |
| Low Frequency | 2.73E−07 | >8 |
| Low Frequency and Pressure | 2.27E−09 | >9 |

It can be seen that the electrical current characteristics of the silicon dioxide films deposited using a low RF frequency are superior to those deposited using a high RF frequency. A reduction in the process pressure further improves the electrical characteristics. For a dielectric film, it is desirable to maximise the breakdown voltage and minimise the leakage current at a fixed potential such as 2 MV/cm.

Figure 2:
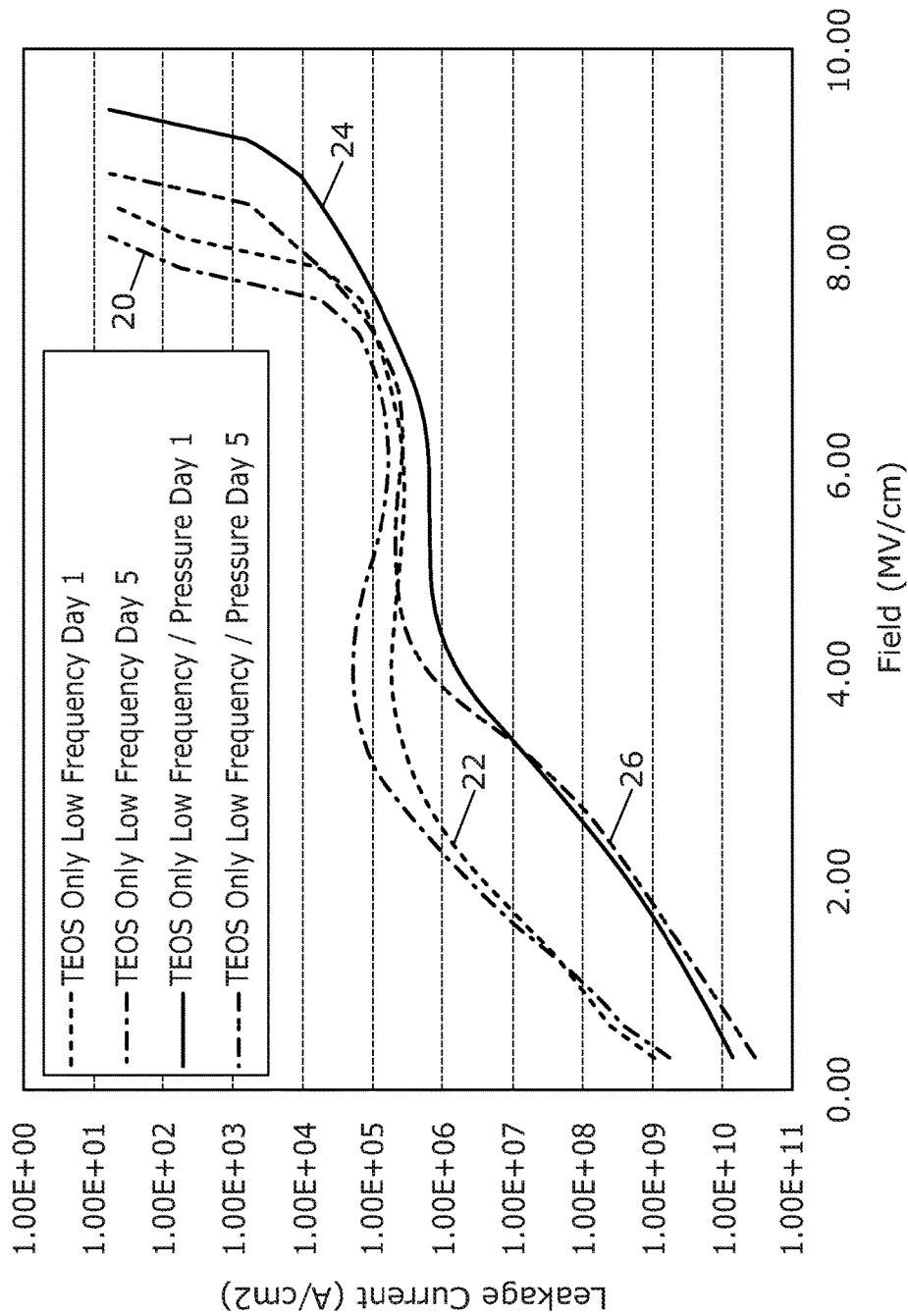
FIG. 2 shows I-V curves obtained directly after deposition and after five days.

Film stability was investigated by measuring electrical properties directly after deposition and after exposure of the film to ambient conditions for five days. FIG. 2 shows the associated I-V curves. Curves 20, 22 correspond to the low RF frequency deposition measured directly after deposition and after five days, respectively. Curves 24, 26 correspond to the low RF frequency and low pressure deposition measured directly after deposition and after five days, respectively. Table 5 shows leakage current measured directly after deposition and after five days. The films obtained using low RF frequency show only a marginal increase over five days. The films obtained using low RF frequency with low pressure deposition show no increase in leakage current, which indicates minimal reabsorption.

TABLE 5

Leakage current at breakdown voltage at deposition and after five days.

| | Leakage Current @ 2 MV/cm (A/cm$^2$) | |
|---|---|---|
| Deposition conditions | As Deposited | Day 5 |
| Low Frequency RF | 2.73E−07 | 4.4E−07 |
| Low Frequency RF and Pressure | 2.27E−09 | 1.64E−09 |

FTIR spectra were also obtained over this period. Table 6 shows normalised FTIR peak areas corresponding to the 3400 cm$^{-1}$ and 950 cm$^{-1}$—OH absorptions. Again, the adhesion layer deposited using low RF frequency and low deposition pressure shows a lower moisture content than the other films. Regarding the films obtained with the higher process pressure conditions, the low RF frequency adhesion layer shows significantly lower moisture content than the high RF frequency adhesion layer.

TABLE 6

Normalised —OH peak area ratio from FTIR spectra for various films.

| | Normalised —OH Peak Area | | | |
|---|---|---|---|---|
| | 3400 cm$^{-1}$ | | 950 cm$^{-1}$ | |
| | As Deposited | 5 Days | As Deposited | 5 Days |
| High Frequency | 0.126 | 0.190 | 0.003 | 0.007 |
| Low Frequency | 0.053 | 0.113 | −0.006 | −0.002 |
| Low Frequency/Pressure | 0.045 | 0.092 | −0.005 | −0.002 |

The carbon content of the silicon dioxide adhesion layers was measured and compared to silicon dioxide layers deposited using conventional TEOS PECVD processes. These results are shown in Table 7. It can be seen that the silicon dioxide adhesion layers of the invention have a higher $CH_x$ content than the conventionally obtained silicon dioxide films. The $CH_x$ content is expressed as the $CH_x$:SiO ratio. This ratio is obtained by comparing peak areas in FTIR spectra corresponding to $CH_x$ and SiO absorptions.

Figure 3:
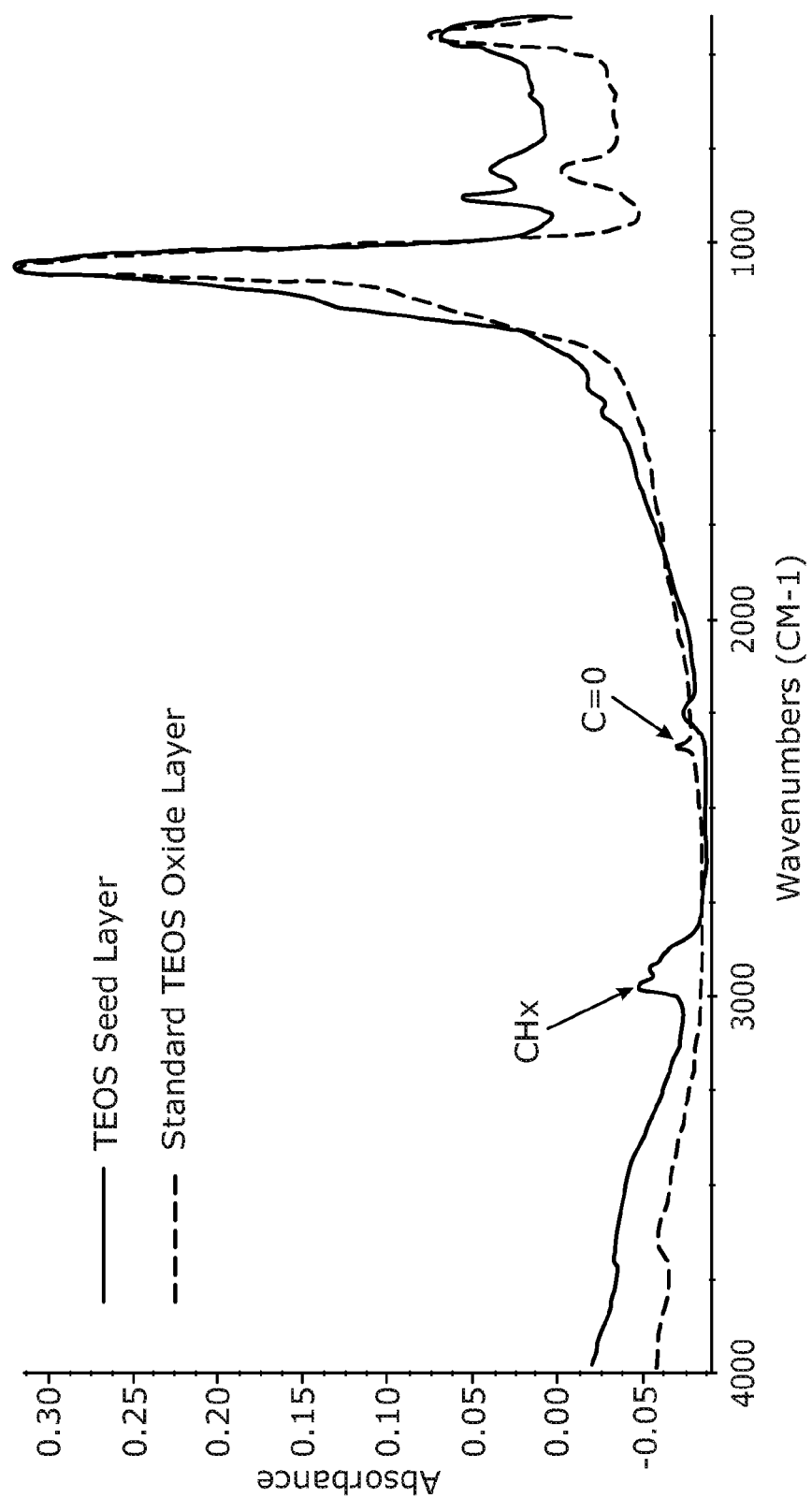
FIG. 3 shows FTIR spectra of a silicon dioxide layer obtained using a conventional TEOS based PECVD process and using a TEOS based PECVD process with no O$_2$ present.

FIG. 3 show FTIR Spectra of a silicon dioxide adhesion layer of the invention and a silicon dioxide layer deposited using a conventional TEOS PECVD process. The large peak at ca. 1080 cm$^{-1}$ is the SiO stretching absorption. The peaks at ca. 2900-3000 cm$^{-1}$ are associated with $CH_x$ absorptions. The $CH_x$:SiO peak area ratios presented below are obtained by calculating the ratio of the integrated area of the 2900-3000 cm$^{-1}$ peaks to the integrated area of the 1080 cm$^{-1}$ peak.

The $CH_x$ groups render the silicon dioxide adhesion layer slightly hydrophobic. This is compatible with the hydrophobic contaminated surface of the silicon substrate. It is noted that silicon dioxide layers deposited using silane based PECVD have no carbon bonding and are also hydrophilic in nature.

TABLE 7

$CH_x$:SiO ratios for TEOS based $SiO_2$ depositions.

| Film | $CH_x$:SiO Peak Area Ratio (%) |
|---|---|
| TEOS Oxide standard | 0 |
| TEOS 500 sccm $O_2$ | 0.379 |
| TEOS No $O_2$ | 4.068 |

Deposition of Dielectric Layer

A range of dielectric films were deposited including silicon nitrides and silicon dioxide films deposited by TEOS based PECVD and silane based PECVD. Films were deposited at thicknesses ranging from 500 nm to 3 microns and temperatures from 50-400° C. Films were deposited either directly onto the contaminated silicon surface, or onto a silicon dioxide adhesion layer. Representative deposition conditions are shown in Table 8.

TABLE 8

Deposition conditions use for sample preparation
(HF = High frequency RF = 13.56 MHz, LF = Low frequency
RF = 380 kHz).

| Process | Temp (° C.) | Pressure (Torr) | Si reactant flow | O/N reactant flow (sccm) | RF Power (Watts) |
|---|---|---|---|---|---|
| TEOS Based SiO$_2$ | 125 | 3.1 | 1.45ccm TEOS | 2300 O$_2$ | 945 HF/ 420 LF |
| Silane based SiO$_2$ | 300 | 2.15 | 175 sccm SiH$_4$ | 3000 N$_2$O | 550 HF |
| Si$_3$N$_4$ | 265 | 0.7 | 125 sccm SiH$_4$ | 245 NH$_3$/ 1800 N$_2$ | 57 HF |

Properties of Deposited Dielectric Layers

Adhesion tests were performed with dielectric films deposited directly onto the contaminated silicon surface. Experiments were also performed depositing a 100 nm silicon dioxide adhesion layer onto the silicon surface and subsequently depositing the dielectric layer onto the adhesion layer by PECVD. The adhesion layer was deposited using the low RF frequency, low pressure PECVD process described above. The thicknesses of the deposited dielectric layers were 3 microns, 600 nm and 500 nm for the TEOS based silicon dioxide, silane based silicon dioxide, and silicon nitride films, respectively. The results of the adhesion tests shown in Table 9.

TABLE 9

Adhesion tests on dielectric layers deposited onto contaminated silicon surface with and without an intermediate adhesion layer.

| | Dielectric | Adhesion Test Results |
|---|---|---|
| Comparative Example 1 | Silicon dioxide (TEOS based PECVD) | 0% |
| Comparative Example 2 | Silicon dioxide (silane based PECVD) | 10% pass |
| Comparative Example 3 | Silicon nitride | 5% pass |
| Example 1 | Silicon dioxide (TEOS based PECVD)/ Silicon dioxide adhesion layer | 100% pass |
| Example 2 | Silicon dioxide (silane based PECVD)/ silicon dioxide adhesion layer | 100% pass |
| Example 3 | Silicon nitride/silicon dioxide adhesion layer | 100% pass |

Without wishing to be limited by any particular theory or conjecture, the silicon dioxide adhesion layer is thought to act as a bonding layer between the hydrophobic surface of the contaminated silicon and the slightly hydrophilic dielectric layers. Again without wishing to be limited by any particular theory or conjecture, it is believed that with the low or no oxygen flow utilised in the invention to produce the silicon dioxide adhesion layer, the process substantially or even wholly relies on oxygen liberated from TEOS to form the silicon dioxide layer.

The invention can be used to deposit a wide range of dielectric layers onto the adhesion layer by PECVD. It is particularly convenient when the deposited dielectric layer is also silicon dioxide. The strength of the bond is then maximised by allowing the 'seed' deposition of the adhesion layer to proceed into the main silicon dioxide dielectric layer without interrupting deposition. This results in a continuous transition between films, promoting excellent adhesion of the composite layer.

What is claimed is:

1. A method of improving adhesion between a semiconductor substrate and a dielectric layer comprising the steps of:
    depositing a silicon dioxide adhesion layer onto the semiconductor substrate by a first plasma enhanced chemical vapor deposition (PECVD) process; and
    depositing the dielectric layer onto the adhesion layer by a second PECVD process;
    in which the first PECVD process is performed in a gaseous atmosphere comprising tetraethyl orthosilicate (TEOS) either in the absence of O$_2$ or with O$_2$ introduced into the process at a flow rate of 250 sccm or less.
2. A method according to claim 1 in which O$_2$ is introduced into the process at a flow rate of 100 sccm or less.
3. A method according to claim 2 in which O$_2$ is introduced into the process at a flow rate of 10 sccm or less.
4. A method according to claim 1 in which the semiconductor substrate is silicon.
5. A method according to claim 1 in which the dielectric layer is a silicon-containing material.
6. A method according to claim 5 in which the dielectric layer is silicon nitride, silicon oxide or silicon carbide.
7. A method according to claim 1 in which the first PECVD process uses a first RF signal to produce a plasma, wherein the first RF signal is of a frequency of less than 400 kHz.
8. A method according to claim 1 in which the first PECVD process is performed in a gaseous atmosphere which comprises H$_2$.
9. A method according to claim 8 in which H$_2$ is introduced into the first PECVD process at a flow rate in the range 500 to 1200 sccm.
10. A method according to claim 1 in which the silicon dioxide adhesion layer has a thickness of 1000 nm or less.
11. A method according to claim 10 in which the silicon dioxide adhesion layer has a thickness of 200 nm or less.
12. A method according to claim 1 in which the adhesion layer has a CH$_x$:SiO ratio of at least 0.3% as calculated by comparing peak areas obtained by FTIR which are associated with CH$_x$ and SiO absorptions, wherein x is 1 to 3.
13. A method according to claim 12 in which the CH$_x$:SiO ratio is at least 3%.
14. A method according to claim 1 in which the first PECVD process is performed at a pressure in the range 3.0 to 4.0 Torr.
15. A method according to claim 14 in which the first PECVD process is performed at a pressure in the range 2.5 to 3.5 Torr.
16. A method according to claim 1 in which the first PECVD process is performed at a temperature in the range 100 to 200° C.
17. A structure comprising a semiconductor substrate, a dielectric layer and a silicon dioxide adhesion layer formed between the semiconductor substrate and the dielectric layer, the structure being manufactured by a method according to claim 1.

* * * * *

UNITED STATES PATENT AND TRADEMARK OFFICE
CERTIFICATE OF CORRECTION

PATENT NO. : 10,096,468 B2  
APPLICATION NO. : 15/383162  
DATED : October 9, 2018  
INVENTOR(S) : Kathrine Crook, Stephen R Burgess and Andrew Price Page 1 of 1

It is certified that error appears in the above-identified patent and that said Letters Patent is hereby corrected as shown below:

On the Title Page

Add Item (30) Foreign Application Priority Data, December 21, 2015 (GB)............1522552.7

Signed and Sealed this
Sixteenth Day of April, 2019

Andrei Iancu
*Director of the United States Patent and Trademark Office*